US011004701B2

(12) United States Patent
Suemasa

(10) Patent No.: US 11,004,701 B2
(45) Date of Patent: May 11, 2021

(54) BREAK-IN APPARATUS, BREAK-IN SYSTEM AND STORAGE MEDIA

(71) Applicant: EBARA CORPORATION, Tokyo (JP)

(72) Inventor: Shuichi Suemasa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 292 days.

(21) Appl. No.: 16/131,572

(22) Filed: Sep. 14, 2018

(65) Prior Publication Data
US 2019/0088509 A1 Mar. 21, 2019

(30) Foreign Application Priority Data

Sep. 19, 2017 (JP) .............................. JP2017-178534

(51) Int. Cl.
A46B 13/02 (2006.01)
B08B 1/04 (2006.01)
H01L 21/02 (2006.01)
H01L 21/67 (2006.01)
H01L 21/687 (2006.01)

(52) U.S. Cl.
CPC ........ H01L 21/67046 (2013.01); A46B 13/02 (2013.01); B08B 1/04 (2013.01); H01L 21/02052 (2013.01); H01L 21/67017 (2013.01); H01L 21/6719 (2013.01); H01L 21/67034 (2013.01); H01L 21/67253 (2013.01); H01L 21/67276 (2013.01); H01L 21/68728 (2013.01); H01L 21/68785 (2013.01)

(58) Field of Classification Search
CPC ..... A46B 13/02; B08B 1/04; H01L 21/02052; H01L 21/67017; H01L 21/67034; H01L 21/67046; H01L 21/67051; H01L 21/6719; H01L 21/67253; H01L 21/67276; H01L 21/68728; H01L 21/68785
USPC ....................................... 15/244.4; 134/58 R
See application file for complete search history.

(56) References Cited

U.S. PATENT DOCUMENTS

| 6,059,889 A | 5/2000 | Jensen et al. |
| 2007/0294058 A1 | 12/2007 | Kitamoto et al. |
| 2009/0318060 A1 | 12/2009 | Dhandapani et al. |
| 2015/0020851 A1 | 1/2015 | Sakurai et al. |
| 2016/0126113 A1 | 5/2016 | Ishibashi |
| 2016/0329219 A1 | 11/2016 | Lee et al. |
| 2017/0189944 A1 | 7/2017 | Tien et al. |
| 2017/0229323 A1 | 8/2017 | Watanabe |

FOREIGN PATENT DOCUMENTS

| JP | H05-317816 A | 12/1993 |
| JP | H11-288911 A | 10/1999 |
| JP | 2008-311481 A | 12/2008 |

(Continued)

OTHER PUBLICATIONS

Singapore Patent Application No. 10201808142T; Search Report and Written Opinion; dated Feb. 2, 2021; 11 pages.

(Continued)

Primary Examiner — Levon J Shahinian
(74) Attorney, Agent, or Firm — BakerHostetler

(57) ABSTRACT

A break-in apparatus 100 has a supply unit 20 for supplying a cleaning liquid, a substrate support unit 30 for holding a dummy substrate W1 and a cleaning member holding unit 40 for performing a break-in processing on the cleaning member 200 by rotating the cleaning member 200 and bringing the cleaning member 200 into contact with the dummy substrate W1.

12 Claims, 13 Drawing Sheets

(56) References Cited

FOREIGN PATENT DOCUMENTS

| | | |
|---|---|---|
| JP | 2011-525705 A | 9/2011 |
| JP | 2015-065379 A | 4/2015 |
| JP | 2016-092158 A | 5/2016 |
| KR | 2014-0137754 A | 12/2014 |
| SG | 11201910551 S | 12/2019 |

OTHER PUBLICATIONS

Japan Patent Application No. 2017-178534; Notice of Reasons for Refusal; dated Mar. 2, 2021; 16 pages.

BREAK-IN APPARATUS, BREAK-IN SYSTEM AND STORAGE MEDIA

TECHNICAL FIELD

The present invention relates to a break-in apparatus and a break-in system for breaking in a cleaning member.

The present application claims the priority of Japanese Patent Application No. 2017-178534 filed on Sep. 19, 2017, the contents of which are entirely incorporated by reference.

BACKGROUND

There have been conventionally known, as methods for cleaning a substrate such as wafer, roll cleaning in which a roll cleaning member such as cylindrical sponge is held such that its center axis is parallel with the surface of a substrate, and is rotated around the center axis thereby to scrub the surface of the substrate by the side of the roll cleaning member, and pencil cleaning in which a pencil cleaning member such as cylindrical sponge is held such that its center axis is orthogonal to the surface of a substrate, and its bottom is in contact with the surface of the substrate to rotate the substrate, thereby scrubbing the surface of the substrate (see Japanese Patent Application Laid-Open No. 2016-92158, for example).

When a cleaning member such as new roll cleaning member or new pencil cleaning member is used, the new cleaning member cannot be used to clean a substrate as it is in order to prevent a failure on the substrate such as wafer, and needs to be subjected to a break-in processing.

SUMMARY OF INVENTION

Problems to be Solved by Invention

A cleaning member break-in processing has been conventionally performed by a substrate cleaning apparatus itself, and there is a problem that a substrate cannot be cleaned by the substrate cleaning apparatus during the break-in processing and the substrate cleaning apparatus can be used to clean a substrate for a short time in a certain period.

It is an object of the present invention to eliminate or reduce a break-in processing by a substrate cleaning apparatus, thereby shortening a time in which the substrate cleaning apparatus stops operating.

Means of Solving Problems

[Concept 1]

A break-in apparatus according to the present invention may be a break-in apparatus for performing a break-in processing on a cleaning member comprising:

a supply unit for supplying a cleaning liquid;

a substrate support unit for holding a dummy substrate; and a cleaning member holding unit for performing the break-in processing on the cleaning member by rotating the cleaning member and bringing the cleaning member into contact with the dummy substrate.

[Concept 2]

In the break-in apparatus according to Concept 1, the cleaning member holding unit may be configured to be able to hold three or more cleaning members.

[Concept 3]

In the break-in apparatus according to Concept 1 or 2, the cleaning member may be a roll cleaning member or a pencil cleaning member.

[Concept 4]

In the break-in apparatus according to anyone of Concepts 1 to 3, the cleaning member holding unit may be configured to be able to hold two or more cleaning members and to contract the cleaning members with each of a front side and a backside of the dummy substrate, and the substrate support unit may hold the dummy substrate to vertically extend.

[Concept 5]

The break-in apparatus, according to any one of Concepts 1 to 4, may further comprise a first movement unit for enabling the break-in apparatus to move.

[Concept 6]

In the break-in apparatus according to any one of Concepts 1 to 5, the supply unit may start to supply the cleaning liquid from inside the cleaning member, and then the supply unit may start to supply the cleaning liquid from outside the cleaning member.

[Concept 7]

The break-in apparatus, according to any one of Concepts 1 to 6, may further comprise a detection unit for detecting a force applied to the cleaning member.

[Concept 8]

The break-in apparatus, according to any one of Concepts 1 to 7, may further comprise a first communication unit for making communication with a substrate cleaning apparatus, wherein the break-in apparatus may start the break-in processing for the cleaning member when receiving information from the first communication unit.

[Concept 9]

The break-in apparatus, according to any one of Concepts 1 to 8, may further comprise a recovery and use unit for recovering and using the cleaning liquid supplied to the dummy substrate, wherein the supply unit may supply the dummy substrate with the cleaning liquid recovered by the recovery and use unit.

[Concept 10]

In the break-in apparatus according to anyone of Concepts 1 to 9, the cleaning member holding unit may be able to hold a dummy cleaning member.

[Concept 11]

A break-in system according to the present invention may comprise:

a break-in apparatus having a supply unit for supplying a cleaning liquid, a substrate support unit for holding a dummy substrate, and a cleaning member holding unit for holding a cleaning member removably and performing a break-in processing on the cleaning member by rotating the cleaning member and bringing the cleaning member into contact with the dummy substrate; and a substrate cleaning apparatus for cleaning a substrate by a cleaning member, wherein the substrate cleaning apparatus may be able to transmit information about exchanging the cleaning member used in the substrate cleaning apparatus to the break-in apparatus.

[Concept 12]

A break-in system according to the present invention may comprise:

a break-in apparatus having a supply unit for supplying a cleaning liquid, a substrate support unit for holding a dummy substrate, a cleaning member holding unit for holding a cleaning member removably and performing a break-in processing on the cleaning member by rotating the cleaning member and bringing the cleaning member into contact with the dummy substrate, and a first communication unit for receiving information about exchanging the cleaning member from outside;

a substrate cleaning apparatus for cleaning a substrate by a cleaning member, the substrate cleaning apparatus having a second communication unit for transmitting the information about exchanging the cleaning member to the break-in apparatus; and a break-in control unit having a program for controlling the break-in apparatus based on the information about exchanging the cleaning member, wherein the information about exchanging the cleaning member may include cleaning member identification information and apparatus identification information.

[Concept 13]

A storage media according to the present invention may be a readable storage media storing a program, which works in a computer, for controlling the break-in system according to Concept 12, wherein the program, in operation, may make the computer control the break-in system so that the break-in system according to Concept 12 performs the break-in processing on the cleaning member.

Effect of Invention

If the break-in apparatus according to the present invention is employed, the break-in processing by the substrate cleaning apparatus is eliminated or reduced, thereby shortening a time in which the substrate cleaning apparatus stops operating. Further, it is possible to more appropriately perform the break-in processing depending on the sizes, the shapes, and the surface properties of the respective cleaning members used in the substrate cleaning apparatus.

EMBODIMENT OF INVENTION

First Embodiment

<<Configuration>>

Figure 1:
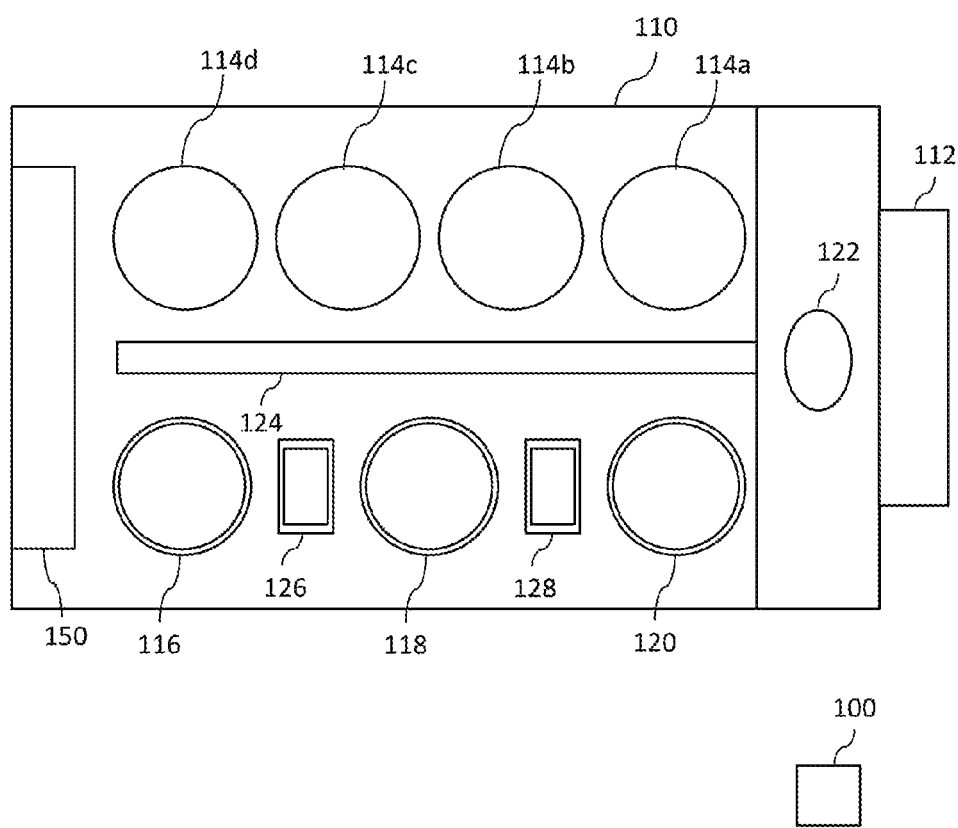
FIG. 1 is a plan view showing an entire configuration of a processing apparatus including a substrate processing apparatus according to a first embodiment of the present invention.

An embodiment of a substrate processing apparatus having a substrate cleaning apparatus according to the present invention will be described below with reference to the drawings. The substrate processing apparatus will be first described. A break-in apparatus 100 according to the present embodiment is directed for performing a break-in processing on cleaning members 200 such as roll cleaning members 210 and pencil cleaning members 220 which are used in the substrate cleaning apparatus in the substrate processing apparatus. The break-in processing is to condition contact parts such as the surfaces contacting with a substrate W in the cleaning members 200 for cleaning the substrate W before being used for cleaning the substrate W.

The break-in processing is to previously flatten a physically uneven state of the surface of a cleaning member 200, and is performed to start cleaning a substrate W by the "broken-in" surface. The contact part of a cleaning member 200 for cleaning a substrate W may be made of a porous member. In such a case, foreign substances may attach in fine pores of the porous member of the cleaning member 200 in a step of manufacturing the cleaning member 200, for example, and the break-in processing is performed in order to previously remove the foreign substances.

As shown in FIG. 1, the substrate processing apparatus, according to the present embodiment, has a roughly rectangular housing 110 and a load port 112; a substrate cassette that stocks a number of substrates is put on the load port 112. The load port 112 is placed adjacent to the housing 110. The load port 112 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 110, a plurality of (in an aspect shown in FIG. 1, four) polishing units 114*a* to 114*d*, first and second cleaning units 116 and 118 for cleaning a polished substrate, and a drying unit 120 for drying the cleaned substrate are contained. The polishing units 114a to 114d are arranged along a long side of the substrate processing apparatus, and the cleaning units 116 and 118 and the drying unit 120 are also arranged along the long side of the substrate processing apparatus. The substrate processing apparatus according to the present embodiment can polish various substrates in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM). The substrate processing apparatus according to other embodiment may be configured to clean and dry a substrate W without a polishing unit for polishing the substrate W inside the housing 110.

In an area surrounded by the load port 112, and the polishing unit 114a and the drying unit 120 that are located on the side of the load port 112, a first transfer robot 122 is placed. Furthermore, a conveyance unit 124 is placed parallel to the polishing units 114a to 114d as well as the cleaning units 116 and 118 and the drying unit 120. The first transfer robot 122 receives a pre-polished substrate from the load port 112 and transfers the substrate to the conveyance unit 124, or receives from the conveyance unit 124 a dried substrate W received from the drying unit 120.

Figure 6:
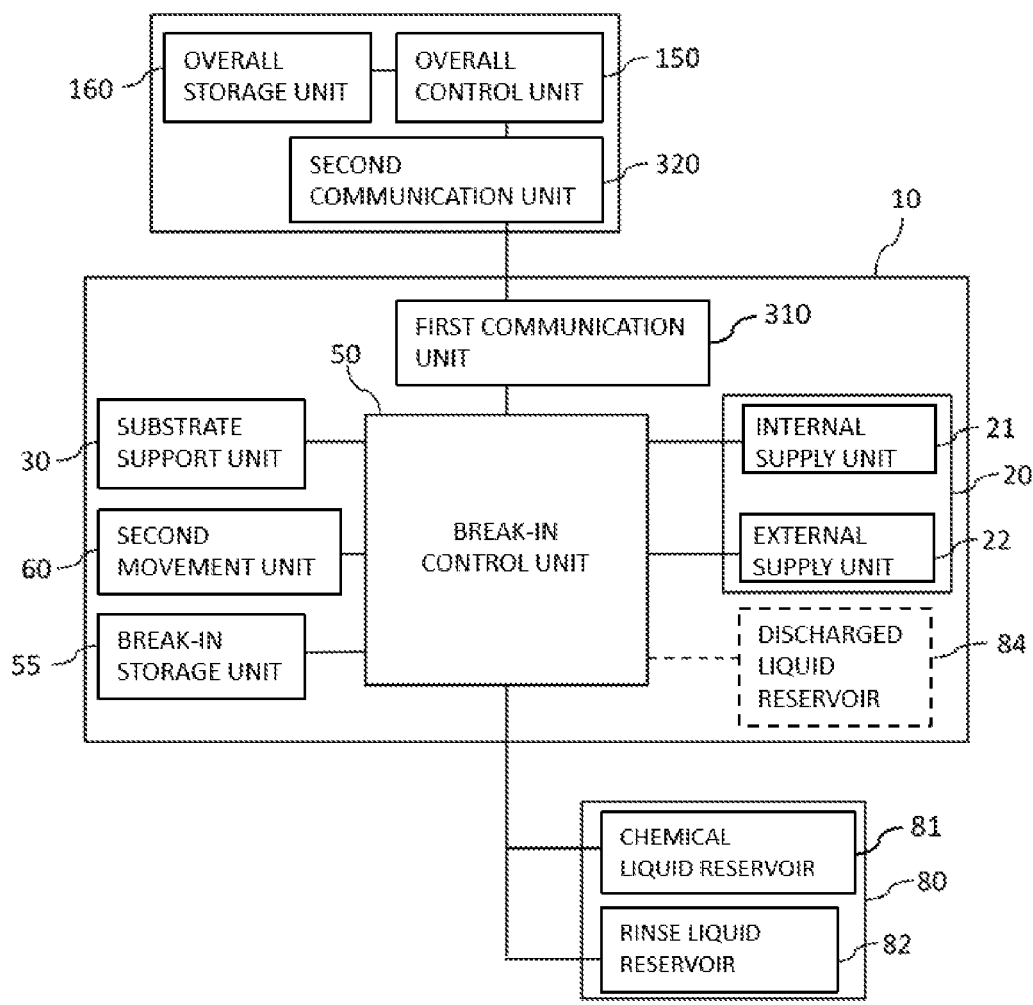
FIG. 6 is a block diagram showing the configurations of the substrate cleaning apparatus, the break-in module, and a cleaning liquid reservoir according to the first embodiment of the present invention.

A second transfer robot 126 for transferring a substrate between the first cleaning unit 116 and the second cleaning unit 118 is placed between the first cleaning unit 116 and the second cleaning unit 118, and a third conveyance unit 128 for transferring the substrate between the second cleaning unit 118 and the dying unit 120 is placed between the second cleaning unit 118 and the drying unit 120. Furthermore, inside the housing 110, an overall control unit 150 for controlling the operation of each device of the substrate processing apparatus is placed. In the present embodiment, there is described the aspect in which the overall control unit 150 is placed inside the housing 110; however, the placement of the overall control unit 150 is not limited to this, and the overall control unit 150 may be placed outside the housing 110, and the overall control unit 150 may be provided at a remote place. As shown in FIG. 6, an overall storage unit 160 for storing various items of information may be connected to the overall control unit 150.

A roll cleaning apparatus for scrubbing a surface of a substrate while rotating around the center axis parallel with the substrate by bringing the roll cleaning members 210 (see FIG. 4) linearly extending almost along the full diameter of the substrate into contact with a cleaning liquid may be used for the first cleaning unit 116. For example, the cleaning members 200 may be brought into contact with a substrate W to clean the substrate W while horizontally or vertically holding and rotating the substrate W. A pencil cleaning apparatus for scrubbing a surface of a substrate by bringing the contact faces of the vertically-extending columnar pencil cleaning members 220 (see FIG. 10) into contact with a cleaning liquid and moving the pencil cleaning members 220 in one direction while rotating may be used for the second cleaning unit 118. A spin drying unit for drying a substrate by injecting IPA steam from a moving injection nozzle toward the horizontally-held and rotating substrate and drying the substrate by centrifugal force by faster rotating the substrate may be used for the drying unit 120. The cleaning members described in FIGS. 2, 3, and 5 in Japanese Patent Application Laid-Open No. 2016-92158, for example, can be used for the roll cleaning members 210 and the pencil cleaning members 220.

The first cleaning unit 116 may use not a roll cleaning apparatus, but a pencil cleaning apparatus similar to the second cleaning unit 118 or a two-fluid jet cleaning apparatus for cleaning a surface of a substrate by two-fluid jet. Further, the second cleaning unit 118 may use not a pencil cleaning apparatus, but a roll cleaning apparatus similar to the first cleaning unit 116, or a two-fluid jet cleaning apparatus for cleaning a surface of a substrate by two-fluid jet.

The cleaning liquid in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. In the present embodiment, unless otherwise specified, cleaning liquid means either rinse liquid, chemical liquid or the both rinse liquid and chemical liquid.

As described above, the break-in apparatus 100 is directed for breaking in the cleaning members 200 such as the roll cleaning members 210 or the pencil cleaning members 220. The break-in apparatus 100 is placed outside the housing 110 as shown in FIG. 1, for example. The break-in apparatus 100 is not limited to the placement, and may be placed inside the housing 110. An aspect in which the roll cleaning members 210 are employed for the cleaning members 200 will be described according to the present embodiment. As described below, the cleaning members 200 can employ the pencil cleaning members 220 to break in the pencil cleaning members 220.

The break-in apparatus 100 has a casing 5, a break-in module 10 provided inside the casing 5, a break-in control unit 50 for controlling the break-in module 10, and a break-in storage unit 55 for storing various items of information. The break-in control unit 50 is configured of a touch panel or the like, for example, and may be provided on the side of the casing 5. The present embodiment will be described by way of an aspect in which two break-in modules 10 are provided inside the casing 5, but is not limited thereto, and one break-in module 10 may be provided inside the casing 5 or three or more break-in modules 10 may be provided inside the casing 5. When a plurality of break-in modules 10 are provided inside the casing 5, one or more break-in modules 10 may break in the roll cleaning members 210 and another one or more break-in modules 10 may break in the pencil cleaning members 220.

The break-in apparatus 100 may have first movement units 90 for enabling the break-in apparatus 100 to move. By way of example, the first movement units 90 such as casters may be provided on the lower face of the casing 5. The break-in apparatus 100 may have lock units 91 for locking not to move by the first movement units 90. The present embodiment will be described by way of an aspect in which four first movement units 90 and four corresponding lock units 91 are provided.

Figure 3:
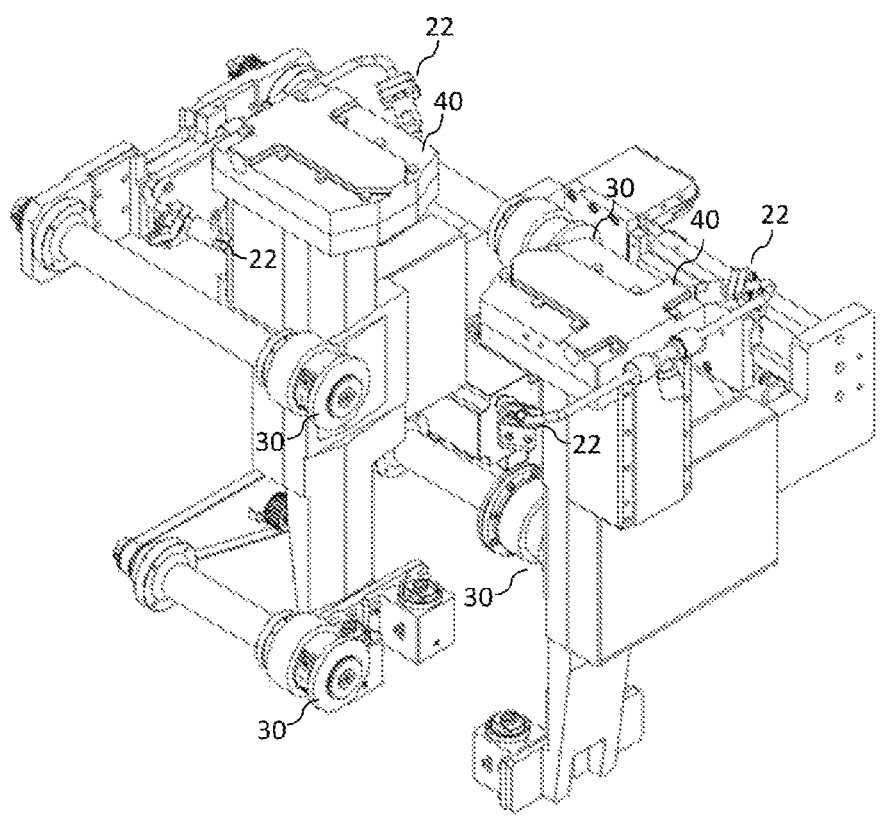
FIG. 3 is a perspective view showing a configuration in a break-in module usable in the first embodiment of the present invention.

As shown in FIG. 3, the break-in module 10 in the break-in apparatus 100 may have supply units 20 (see FIG. 6) for supplying a cleaning liquid, substrate support units 30 for holding a dummy substrate W1, and cleaning member holding units 40 for breaking in the cleaning members 200 by rotating the cleaning members 200 and bringing the cleaning members 200 into contact with the dummy substrate W1. A cleaning liquid supplied from the supply units 20 is supplied to the dummy substrate W1 held by the substrate support units 30.

A cleaning liquid supplied from the supply units 20 may be a rinse liquid or a chemical liquid. When a chemical liquid is supplied from the supply units 20, it is beneficial to employ an aspect in which a rinse liquid is supplied after a chemical liquid finishes being supplied in order not to leave the chemical liquid in the roll cleaning members 210. A rinse liquid may typically use pure water.

As shown in FIG. 6, a supply unit 20 may have an internal supply unit 21 for supplying a cleaning liquid from inside a roll cleaning member 210, and an external supply unit 22 for supplying a cleaning liquid from outside the roll cleaning member 210. In the aspect, the break-in control unit 50 may start supplying a cleaning liquid from inside the roll cleaning members 210 by the internal supply units 21, and then may start supplying a cleaning liquid from outside the roll cleaning members 210 by the external supply units 22. The supply unit 20 is not limited to the control, and may have only the external supply unit 22 to supply a cleaning liquid only from outside the roll cleaning member 210, or the supply unit 20 may have only the internal supply unit 21 to supply a cleaning liquid only from inside the roll cleaning member 210. The external supply unit 22 may have a fan-like nozzle, a conical nozzle, or the like configured to spread a cleaning liquid like a spray.

The internal supply units 21 may be able to supply only a rinse liquid, and the external supply units 22 may be able to supply both a chemical liquid and a rinse liquid. A cleaning liquid supplied from the internal supply unit 21 easily accumulates inside the roll cleaning member 210, and thus such an aspect may be employed.

As shown in FIG. 6, there may be configured such that the supply units 20 are coupled to a cleaning liquid reservoir 80 accumulating a cleaning liquid therein, and supply a cleaning liquid supplied from the cleaning liquid reservoir 80. More specifically, there may be configured such that the supply units 20 are coupled to a chemical liquid reservoir 81 accumulating a chemical liquid therein and/or a rinse liquid reservoir 82 accumulating a rinse liquid therein, and supply the chemical liquid and/or the rinse liquid supplied from the chemical liquid reservoir 81 and/or the rinse liquid reservoir 82. The chemical liquid reservoir 81 and the rinse liquid reservoir 82 may be used in the substrate cleaning apparatus, or may be provided separated from the units used in the substrate cleaning apparatus. In the aspect shown in FIG. 6, the cleaning liquid reservoir 80 is connected to the break-in control unit 50, or is electrically connected thereto. There may be physically configured such that the chemical liquid reservoir 81 is coupled to each of the internal supply units 21 and the external supply units 22 and supplies a chemical liquid to each of the internal supply units 21 and the external supply units 22. There may be similarly configured such that the rinse liquid reservoir 82 is coupled to each of the internal supply units 21 and the external supply units 22 and supplies a rinse liquid to each of the internal supply units 21 and the external supply units 22.

A liquid discharge unit (not shown) having a discharge pipe or the like may be able to be coupled to the break-in apparatus 100. A cleaning liquid used in the break-in processing in the break-in apparatus 100 may be discharged via the liquid discharge unit. The break-in apparatus 100 is not limited to the configuration, and may have a discharged liquid reservoir 84 for accumulating the cleaning liquid used in the break-in processing (see FIG. 6). It is beneficial to employ the aspect since the break-in apparatus 100 can be provided at a place where a liquid discharge unit is not provided.

The dummy substrate W1 is preferably configured in the same thickness and the same plane direction as a substrate to be cleaned by the substrate cleaning apparatus, and is more preferably made of the same material as the substrate. However, the dummy substrate W1 may not be patterned or the like unlike the substrate.

The cleaning member holding units 40 may be configured to be able to hold three or more cleaning members 200. The cleaning member holding units 40 are not limited to the configuration, and may be configured to be able to hold one or two cleaning members 200. In the aspects shown in FIG. 3 to FIG. 5, the cleaning member holding units 40 can hold four roll cleaning members 210.

In terms of "breaking in" the roll cleaning members 210 under a similar environment as in actual cleaning, it is beneficial that a rotation speed of the roll cleaning members 210 by the cleaning member holding units 40 is the same as a rotation speed employed in the cleaning step in the substrate cleaning apparatus.

Figure 5:
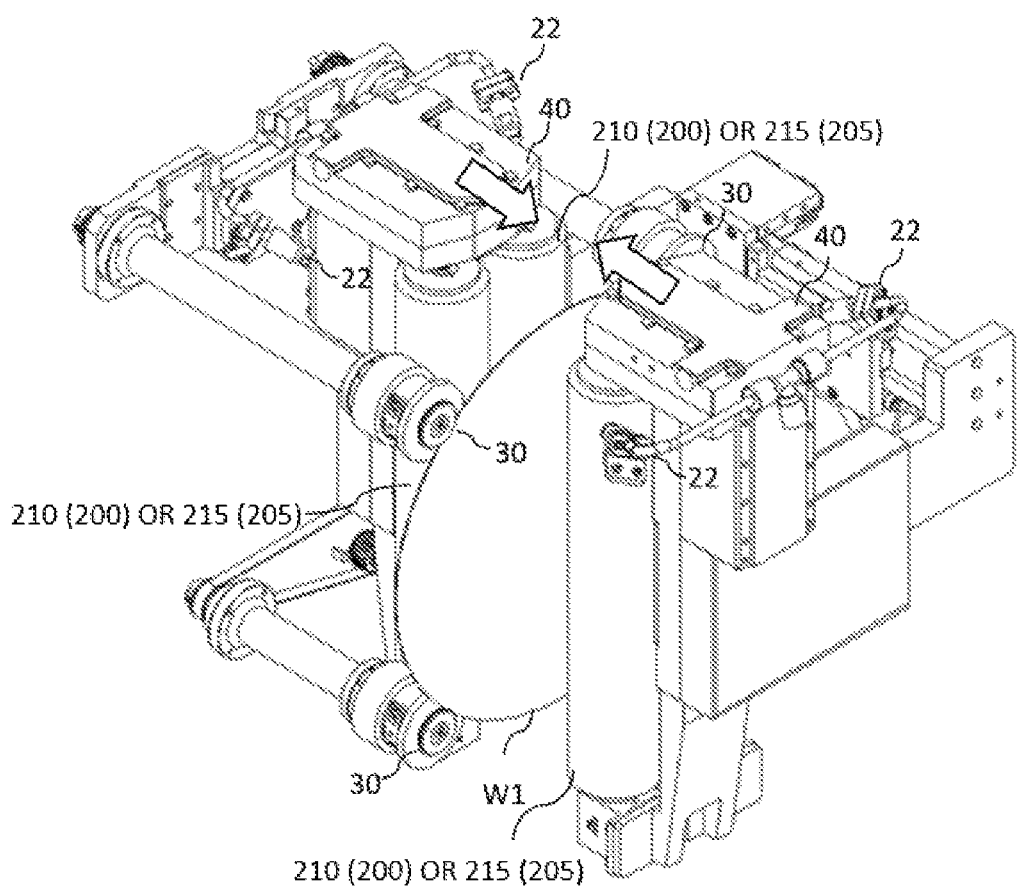
FIG. 5 is a perspective view showing a state in which a dummy substrate is attached to the break-in module in the aspect of FIG. 4.

The substrate support units 30 may be configured to hold the dummy substrate W1 to vertically extend (or the inplane direction of the dummy substrate W1 vertically extends) as shown in FIG. 5. The substrate support units 30 are not limited to the configuration, and may be configured to hold a substrate to horizontally extend or to hold it obliquely relative to the horizontal direction.

Figure 4:
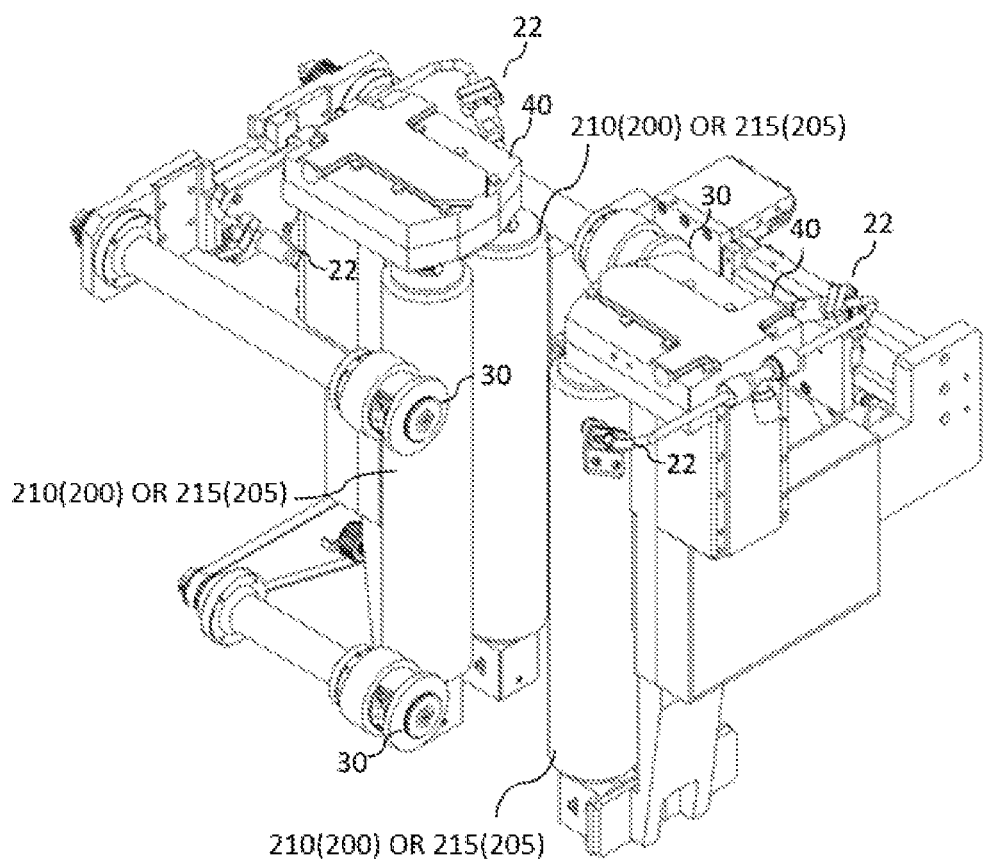
FIG. 4 is a perspective view showing a state in which roll cleaning members or dummy roll cleaning members are attached to the break-in module in the aspect of FIG. 3.

In the aspects shown in FIG. 3 to FIG. 5, the four substrate support units 30 are equally arranged (at an angle of 90° about the rotation center). The substrate support units 30 according to the present embodiment are configured of spindles, and are configured to hold the dummy substrate W1 while rotating it. The substrate support units 30 may employ not such spindles but chucks. In this case, the dummy substrate W1 is held by the chucks, and the dummy substrate W1 held by the chucks is rotated by a driving force from the rotation unit. Any number of substrate support units 30 capable of stably holding the dummy substrate W1 may be employed, and three or six substrate support units 30 may be employed.

When chucks are employed as the substrate support units 30, the substrate support units 30 are opened when not holding the dummy substrate W1, and are closed when holding the dummy substrate W1. There may be configured such that the dummy substrate W1 is controlled to be opened or closed in response to an instruction from the break-in control unit 50, the dummy substrate W1 is placed so that the substrate support units 30 are automatically closed, and the dummy substrate W1 is removed (more than a certain force is applied) so that the substrate support units 30 are automatically opened.

When spindles are employed as the substrate support units 30, the dummy substrate W1 may be rotatably supported in the concave parts with a triangular cross-section provided at the places to support the dummy substrate W1 in the substrate support units 30.

When the dummy substrate W1 is placed in the substrate support units 30, the worker may place the dummy substrate W1 in the substrate support units 30, or a substrate conveyance unit such as robot arm may place the dummy substrate W1 in the substrate support units 30.

Four external supply units 22 are provided in the aspects shown in FIG. 3 to FIG. 5, and one external supply unit 22 may be provided corresponding to one cleaning member holding unit 40 as shown in FIG. 4 and FIG. 5. In such aspects, it is beneficial that a cleaning liquid can be accurately supplied to each roll cleaning member 210.

As shown in FIG. 4 and FIG. 5, the cleaning member holding units 40 may be able to hold dummy cleaning members 205. More specifically, the cleaning member holding units 40 may be able to hold dummy roll cleaning members 215. The dummy roll cleaning members 215 may be configured in the same weight and the same size as the roll cleaning members 210, and may be made of the same material as the roll cleaning members 210.

Second movement units 60 for making the cleaning member holding units 40 close to or separated from the dummy substrate W1 may be coupled to the cleaning member holding units 40 (see arrows in FIG. 5 and FIG. 6). The second movement units 60 may be configured only to make the cleaning member holding units 40 close to or separated from the dummy substrate W1 or may be configured not to swing the cleaning member holding units 40 in order to reduce manufacture cost or to downsize the apparatus configuration.

The second movement units 60 may move or swing the roll cleaning members 210 in the longitudinal direction of the roll cleaning members 210 or along the inplane direction of the dummy substrate W1 orthogonal to the longitudinal direction in order to break in the entire roll cleaning members 210 including both ends in their longitudinal direction.

In the configuration in which three or more roll cleaning members 210 can be held by the cleaning member holding units 40, each of the roll cleaning members 210 cannot contact with a largest-diameter part of the dummy substrate W1. On the other hand, as described above, it is beneficial that the second movement units 60 are configured to move or swing the roll cleaning members 210 in the longitudinal direction of the roll cleaning members 210 or along the inplane direction of the dummy substrate W1 orthogonal to the longitudinal direction so that each of the roll cleaning members 210 can contact with a largest-diameter part of the dummy substrate W1 and the break-in processing can be performed on the entire roll cleaning members 210 including both ends in the longitudinal direction.

In the aspect shown in FIG. 5, the second movement units 60 are provided on both of the front side and the backside of the dummy substrate W1, respectively, and the two roll cleaning members 210 positioned on the front side of the dummy substrate W1 and the two roll cleaning members 210 positioned on the backside of the dummy substrate W1 are synchronized to be moved. The second movement units 60 may be configured of actuators, for example.

The press amount against the dummy substrate W1 by the roll cleaning members 210 may be previously set, and in this case, the roll cleaning members 210 may be pressed against the dummy substrate W1 by the same amount as the roll cleaning members 210 are pressed against a substrate cleaned in the substrate cleaning apparatus. A load of the roll cleaning members 210 on the dummy substrate W1 may be able to be measured in order to measure the press amount, and the break-in processing may be performed while applying the same load as the load of the roll cleaning members 210 against a substrate to be cleaned in the substrate cleaning apparatus on the dummy substrate W1. By way of example, the second movement units 60 may change the load of the roll cleaning members 210 on the dummy substrate W1 in a range of 0 to 12N.

As shown in FIG. 6, the break-in apparatus 100 according to the present embodiment may have a first communication unit 310 for making communication with a second communication unit 320 in the substrate cleaning apparatus. Information may be transmitted from the break-in apparatus 100 to the substrate cleaning apparatus via the first communication unit 310 and the second communication unit 320, and information may be transmitted from the substrate cleaning apparatus to the break-in apparatus 100 via the second communication unit 320 and the first communication unit 310.

<<Method>>

An exemplary method for breaking in the roll cleaning members 210 by use of the break-in apparatus 100 according to the present embodiment is as follows. Though briefly described for avoiding repeated description, all the aspects described in "Configuration" can be applied in "Method." To the contrary, all the aspects described in "Method" can be applied in "Configuration." A program for performing the method according to the present embodiment may be recorded in a storage medium, and the method according to the present embodiment may be performed in the substrate processing apparatus by reading the storage medium by a computer (not shown).

At first, a roll cleaning member 210 to be subjected to the break-in processing is placed in the cleaning member holding units 40 (see FIG. 4). When a smaller number of roll cleaning members 210 than the number (four in the aspects shown in FIG. 3 to FIG. 5) of roll cleaning members 210 which the cleaning member holding units 40 can hold are to be broken in, as many dummy roll cleaning members 215 as the number obtained by subtracting the number of roll cleaning members 210 to be broken in from the number of roll cleaning members 210 capable of being held are placed in the cleaning member holding units 40.

The dummy substrate W1 is then placed in the substrate support units 30 (see FIG. 5). Though not limited to the aspect, the roll cleaning members 210 may be placed after the dummy substrate W1 is placed in the substrate support units 30.

Then, the internal supply units 21 start supplying a cleaning liquid from inside the roll cleaning members 210, and then the external supply units 22 supply a cleaning liquid from outside the roll cleaning members 210.

After the internal supply units 21 start supplying a cleaning liquid, and before or after the external supply units 22 start supplying a cleaning liquid, the cleaning member holding units 40 are made close to the dummy substrate W1 by the second movement units 60 so that each of the roll cleaning members 210 or the roll cleaning members 210 and the dummy roll cleaning members 215 is brought into contact with the dummy substrate W1. At this time, the dummy substrate W1 is rotated by the substrate support units 30, and each of the roll cleaning members 210 or the roll cleaning members 210 and the dummy roll cleaning members 215 is rotated by the cleaning member holding units 40.

Each of the roll cleaning members 210 or the roll cleaning members 210 and the dummy roll cleaning members 215 contacting with the dummy substrate W1 is rotated while the dummy substrate W1 is rotated by the substrate support units 30 for a certain time (one hour, for example) so that the break-in processing ends.

A rotation speed of each of the roll cleaning members 210 or the roll cleaning members 210 and the dummy roll cleaning members 215 may be the same. Further, the rotation speed of each of the roll cleaning members 210 or the roll cleaning members 210 and the dummy roll cleaning members 215 may be a first speed until a first time elapses, and may be a second speed after the first time elapses. In terms of gradual "breaking in," it is beneficial to employ an aspect in which the first speed is lower than the second speed. The first speed is not limited to the aspect, and may be higher than the second speed.

Further, a rotation speed of the dummy substrate W1 may be a third speed until a second time elapses, and may be a fourth speed after the second time elapses. In terms of gradual "breaking in," it is beneficial to employ an aspect in which the third speed is lower than the fourth speed. The third speed is not limited to the aspect, and may be higher than the fourth speed. The first time for the roll cleaning members 210 and the like may be the same as or different from the second time for the dummy substrate W1.

The rotation speed of each of the roll cleaning members 210 or the roll cleaning members 210 and the dummy roll cleaning members 215 may be higher than the rotation speed in the substrate cleaning apparatus. In such an aspect, it can be expected to shorten a time required for the break-in processing. On the other hand, the roll cleaning members 210 can be broken when being rotated too fast, and thus it is considered that the roll cleaning members 210 are rotated at the upper limit revolution or less (at 500 rpm or less, for example).

The above control may be performed by the break-in control unit 50 in the break-in apparatus 100.

When the break-in processing ends as described above, the cleaning member holding units 40 are separated from the dummy substrate W1 by the second movement units 60. More specifically, each of the roll cleaning members 210 or the roll cleaning members 210 and the dummy roll cleaning members 215 is separated from the dummy substrate W1.

Thereafter, the roll cleaning members 210 are removed from the cleaning member holding units 40, and attached to the substrate cleaning apparatus. At this time, the roll cleaning members 210 may be housed in a container such as tray and conveyed.

In terms of keeping the roll cleaning members 210 clean, a cleaning liquid (typically rinse liquid) may be supplied from the internal supply units 21 continuously until the roll cleaning members 210 are removed from the cleaning member holding units 40. Not limited to supply of a cleaning liquid by the internal supply units 21, a cleaning liquid (typically rinse liquid) may be supplied from the external supply units 22 continuously until the roll cleaning members 210 are removed from the cleaning member holding units 40. In terms of efficiently keeping the roll cleaning members 210 clean, however, it is beneficial to employ an aspect in which a cleaning liquid is supplied only from the internal supply units 21.

In terms of keeping the roll cleaning members 210 clean, the roll cleaning members 210 may be rotated by the cleaning member holding units 40 continuously until the roll cleaning members 210 are removed from the cleaning member holding units 40.

The break-in control unit 50 inputs the fact that the break-in processing will end before the roll cleaning members 210 are removed from the cleaning member holding units 40, so that the roll cleaning members 210 may stop being rotated and the cleaning liquid may stop being supplied from the supply units 20.

The roll cleaning members 210 broken in on the front side of the dummy substrate W1 may be used for cleaning the front side of a substrate and the roll cleaning members 210 broken in on the backside of the dummy substrate W1 may be used for cleaning the backside of a substrate. However, when there is employed an aspect in which the dummy substrate W1 is vertically placed and is uniformly broken in, each roll cleaning member 210 may be placed in the substrate cleaning apparatus irrespective of which of the front side and the backside of the dummy substrate W1 it is broken in on.

<<Operations and Effects>>

The operations and effects according to the present embodiment in the above configuration, which have not been described, will be mainly described below. Even if not described in "Configuration," all the configurations described in "Operations and effects" can be employed for the present invention. Similar effects can be expected also when the pencil cleaning members 220 are employed for the cleaning members 200, and thus not the term "roll cleaning members 210" but the term "cleaning members 200" will be basically used for the description in "Operations and effects."

When a cleaning member 200 such as new roll cleaning member 210 or pencil cleaning member 220 is used, it cannot be used for cleaning a substrate as it is, and needs to be broken in. The break-in processing on the cleaning member 200 has been conventionally performed by the substrate cleaning apparatus itself, and thus a substrate cannot be cleaned by the substrate cleaning apparatus during the break-in processing, and there is a problem that the substrate cleaning apparatus is used to clean a substrate W for a short time in a certain period.

In terms of this, when the break-in apparatus 100 according to the present embodiment is employed, the break-in processing by the substrate cleaning apparatus can be eliminated or reduced, thereby shortening a time to stop operating the substrate cleaning apparatus.

When there is employed an aspect in which the cleaning member holding units 40 are configured to be able to hold three or more cleaning members 200, it is beneficial that many cleaning members 200 can be broken in at one time.

When there is employed an aspect in which the cleaning member holding units 40 can hold two or more cleaning members 200 and the cleaning member holding units 40 are configured to contract the cleaning members 200 with each of the front side and the backside of the dummy substrate W1, and the substrate support units 30 hold the dummy substrate W1 to vertically extend, it is beneficial that the break-in processing can be performed on each of the cleaning members 200 contacting with each of the front side and the backside of the dummy substrate W1 under similar conditions. That is, when the dummy substrate W1 is held to horizontally extend and the break-in processing is performed by use of the front side and the backside of the dummy substrate W1, the break-in processing cannot be performed under similar conditions since a cleaning liquid is supplied due to gravity in different ways between the cleaning members 200 contacting with the front side of the dummy substrate W1 and the cleaning members 200 contacting with the backside of the dummy substrate W1. Regarding this point, when the present aspect is employed, it can be expected that the break-in processing can be performed under similar conditions on each of the cleaning members 200 contacting with each of the front side and the backside of the dummy substrate W1.

When the aspect in which the substrate support units 30 hold the dummy substrate W1 to vertically extend is employed, it is beneficial that a cleaning liquid can smoothly flow and the cleaning liquid can be prevented from convecting at the center of the dummy substrate W1.

Figure 2:
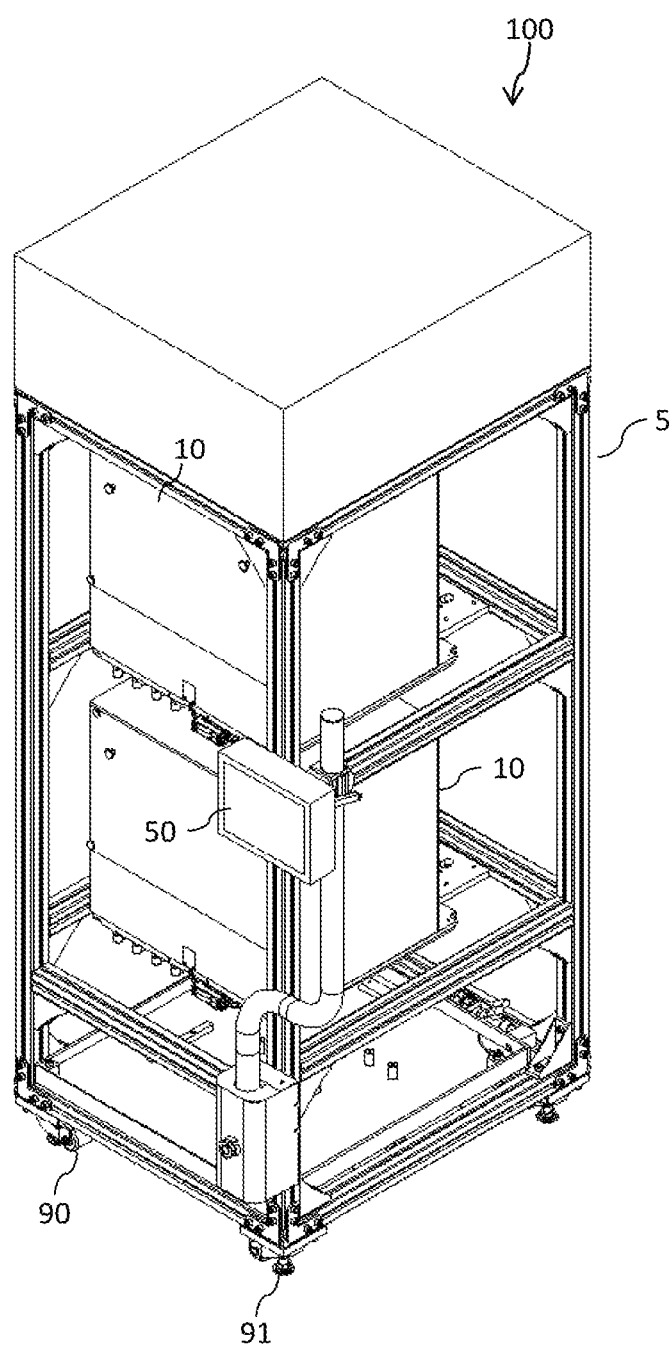
FIG. 2 is a perspective view of a break-in apparatus usable in the first embodiment of the present invention.

When the aspect in which the first movement units 90 for enabling the break-in apparatus 100 to move are provided is employed as shown in FIG. 2, it is beneficial that a position where the break-in apparatus 100 is arranged can be freely changed. If the kind of a substrate to be cleaned is changed or the number of substrates to be cleaned increases, the layout of the substrate cleaning apparatus in the housing can be changed. Thus, it is beneficial that the break-in apparatus 100 is made movable and can be easily arranged in an extra space.

When the first movement units 90 are provided, the break-in apparatus 100 can be moved near the substrate cleaning apparatus in which a roll cleaning member 210 is to be exchanged. Thus, it is possible to reduce a distance at which a broken-in roll cleaning member 210 is removed from the break-in apparatus 100 and the break-in apparatus 100 moves.

When there is employed an aspect in which a cleaning liquid starts being supplied from inside the cleaning members 200 and then a cleaning liquid starts being supplied from outside the cleaning members 200, it is beneficial that the cleaning members 200 can be wet by the cleaning liquid from inside and the break-in processing can be performed on the cleaning members 200 in the substantially wet state. In terms of wetting the cleaning members 200, it is assumed that a timing to supply a cleaning liquid from outside the cleaning members 200 is moved ahead and is matched with a timing to supply a cleaning liquid from inside the cleaning members 200, but it is beneficial that the present aspect is employed to reduce the amount of cleaning liquid to be supplied.

When there is employed an aspect in which the cleaning member holding units 40 can hold the dummy cleaning members 205 such as the dummy roll cleaning members 215, it is beneficial that when a small number of cleaning members 200 need to be broken in, as many dummy roll cleaning members 215 as the number obtained by subtracting the number of cleaning members 200 to be broken in from the number of cleaning members 200 capable of being held in the cleaning member holding units 40 are placed in the cleaning member holding units 40, thereby performing the break-in processing by the dummy substrate W1 without breaking the balance. That is, when the dummy cleaning members 205 are not used for a small number of cleaning members 200 which need to be broken in, the dummy substrate W1 can be tilted or a press force between the dummy substrate W1 and the cleaning members 200 cannot be uniform if not tilted while the break-in processing is being performed on the cleaning members 200 in contact with the dummy substrate W1. Regarding this point, it is beneficial that as many dummy roll cleaning members 215 as the number obtained by subtracting the number of cleaning members 200 to be broken in from the number of cleaning members 200 capable of being held in the cleaning member holding units 40 are placed in the cleaning member holding units, thereby eliminating the above disadvantage.

Second Embodiment

A second embodiment of the present invention will be described below.

Figure 7:
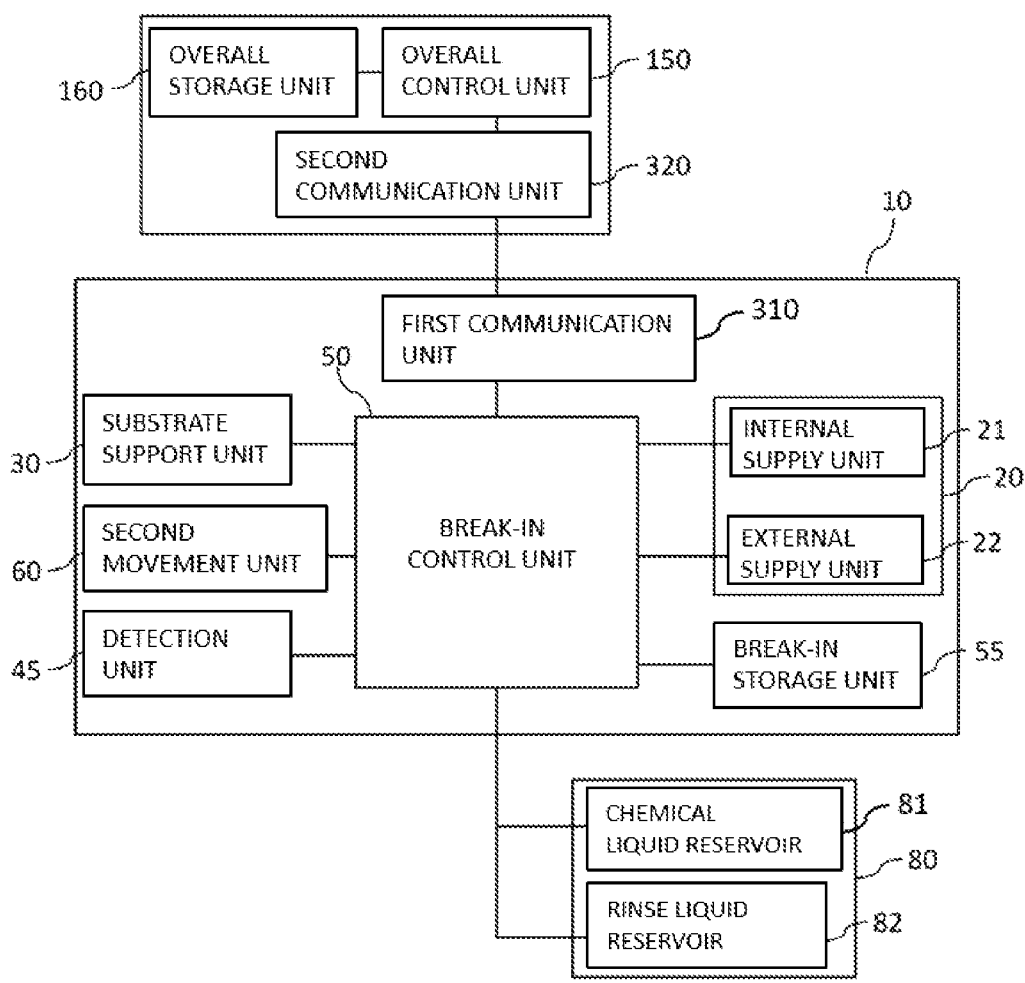
FIG. 7 is a block diagram showing the configurations of the substrate cleaning apparatus, the break-in module, and the cleaning liquid reservoir according to a second embodiment of the present invention.

The break-in apparatus 100 according to the present embodiment has a detection unit 45 for detecting a force applied to the cleaning members 200 as shown in FIG. 7. Other components are similar to those in the first embodiment, and all the aspects described according to the first embodiment can be employed. The same members as those described in the first embodiment are denoted with the same reference numerals, and will be described.

The detection unit 45 can use a press force detection unit for detecting a press force on the cleaning members 200 such as the roll cleaning members 210 and the pencil cleaning members 220. When the aspect is employed, a reactive force applied from the dummy substrate W1 to the cleaning members 200 can be detected by the detection unit 45 when the cleaning members 200 are pressed against the dummy substrate W1. Further, how much the cleaning members 200 are pressed against the dummy substrate W1 can be detected depending on a movement distance of the second movement units 60. The hardness of the cleaning members 200 can be detected based on the reactive force detected by the detection unit 45 and the press amount capable of being measured by the second movement units 60, and the break-in processing may be terminated when the cleaning members 200 are softened to predefined hardness. By use of the aspect, it is beneficial that the break-in processing can be uniformly performed on the cleaning members 200 and the cleaning processing can be uniformly performed in the substrate cleaning apparatus.

Further, the second movement units 60 may be controlled such that a constant force is applied on the cleaning members 200 based on a detection result of the detection unit 45. The break-in processing may be terminated when the distance between the cleaning members 200 reaches a certain value by the second movement units 60. According to the aspect, it is beneficial that the break-in processing can be performed by effortlessly applying a uniform force on the cleaning members 200 and a remarkably large load can be prevented from being applied on the cleaning members 200.

The break-in processing may be terminated when the cleaning members 200 are moved and fixed by a predefined distance by the second movement units 60 and a force applied on the cleaning members 200 reaches the certain value or less based on a detection result of the detection unit 45. According to the aspect, it is beneficial that the second movement units 60 do not need to move the cleaning members 200 and accordingly the control is facilitated.

Third Embodiment

A third embodiment of the present invention will be described below.

The break-in apparatus 100 according to the present embodiment is configured such that the break-in control unit 50 starts the break-in processing for the cleaning members 200 when receiving the information transmitted from the overall control unit 150 to the first communication unit 310. The present embodiment can employ all the aspects described in each of the above embodiments. The same members as those described in each of the above embodiments are denoted with the same reference numerals, and will be described.

A timing to exchange cleaning members 200 generally used in the substrate cleaning apparatus is when a predetermined number of substrates are cleaned by the cleaning members 200, and the timing to exchange can be generally expected. According to the present embodiment, the second communication unit 320 in the substrate cleaning apparatus transmits the information that a timing to exchange cleaning members 200 is approaching to the first communication unit 310 in the break-in apparatus 100 when receiving the information from the overall control unit 150. According to the aspect, it is beneficial that the break-in processing can be started at an appropriate timing and a used cleaning member 200 can be expected to be exchanged to a broken-in cleaning member 200 without any waiting time.

Whether a timing to exchange cleaning members 200 is approaching may be calculated from a time required for the break-in processing, for example. If the break-in processing requires a certain time (one hour, for example), there may be controlled such that the information that a timing to exchange cleaning members 200 is approaching is transmitted from the overall control unit 150 to the break-in control unit 50 slightly longer (several to 10 minutes longer) than the certain time (one hour, for example) and the break-in processing ends at the timing to exchange cleaning members 200. By use of the aspect, it is beneficial that a broken-in cleaning member 200 does not need to be saved in another place and a used cleaning member 200 can be expected to be rapidly exchanged with a broken-in cleaning member 200 without losing the effect of the break-in processing.

When there is employed an aspect in which a cleaning member 200 is rotated while being supplied with a cleaning liquid even after the break-in processing ends, it is beneficial that the waiting time is shortened thereby to shorten a period (idling period) in which the cleaning member 200 is rotated while being supplied with a cleaning liquid.

The cleaning members 200 may be previously placed in the break-in apparatus 100. When the information that a timing to exchange is approaching is sent from the overall control unit 150 to the break-in control unit 50, the break-in control unit 50 may automatically start the break-in processing on the cleaning members 200. By use of the aspect, it is beneficial that the worker only places the cleaning members 200 in the cleaning member holding units 40 thereby to automatically start the break-in processing on the cleaning members 200.

Figure 8:
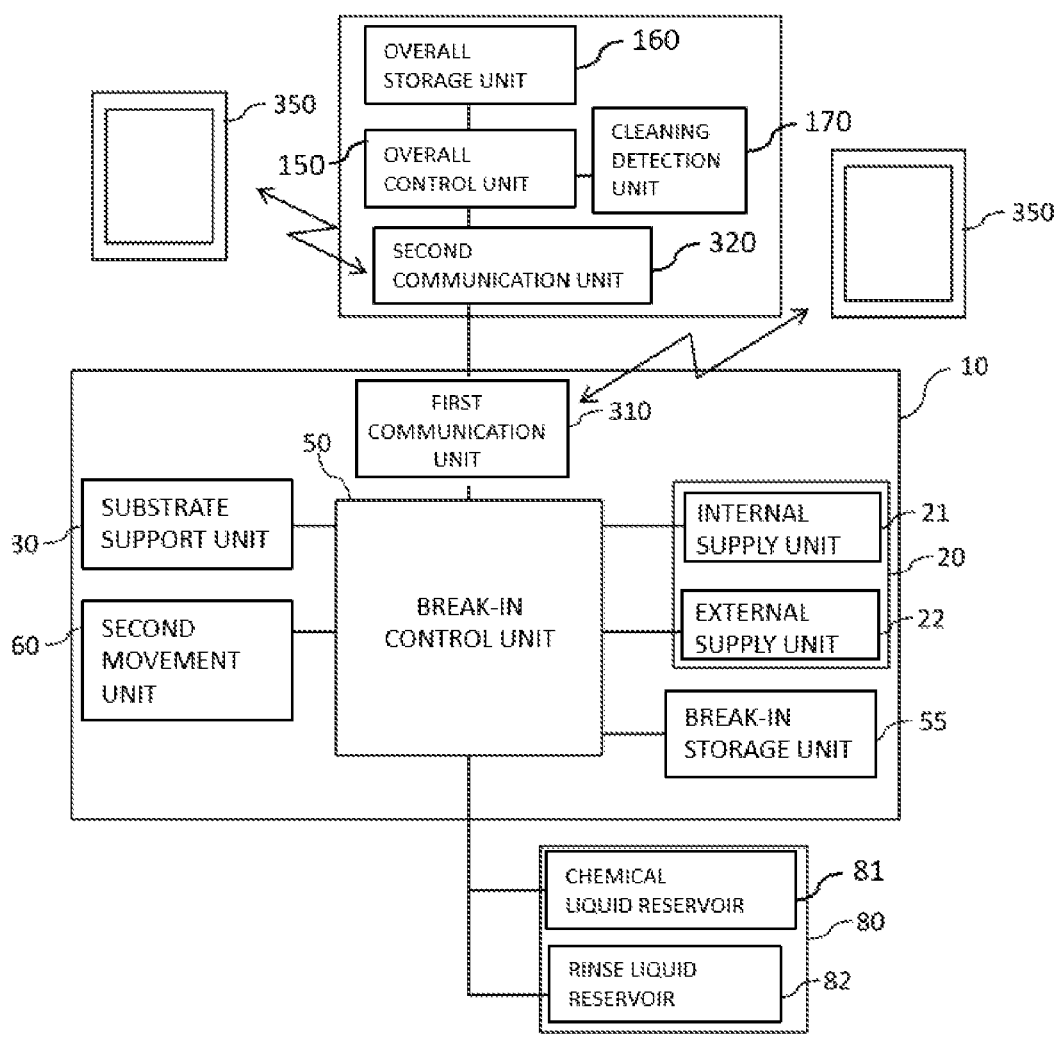
FIG. 8 is a block diagram showing the configurations of the substrate cleaning apparatus, the break-in module, and the cleaning liquid reservoir according to a third embodiment of the present invention.

Further, as shown in FIG. 8, the first communication unit 310 may notify a working state indicting that the break-in processing ended or will end soon to a portable terminal 350 such as Smartphone or cell phone of the worker. Further, the second communication unit 320 may notify a working state indicating that the break-in processing ended or will end soon to the portable terminal 350 such as Smartphone or tablet of the worker. In the aspects, the worker can grasp the progress of the break-in processing while he/she is at a distant place, thereby efficiently exchanging cleaning members 200.

A database as shown in Table 1 may be stored in the overall storage unit 160. The database may be stored in the break-in storage unit 55 or may be stored in the overall control unit 150.

TABLE 1

| ID | Apparatus identification information | Cleaning member identification information | Predetermined time | Accumulated use time |
|---|---|---|---|---|
| 132123 | Apparatus 1 | Pen-1 | 2000 hours | 302 hours |
| 112031 | Apparatus 2 | Roll-2 | 3500 hours | 12 hours |

Figure 10:
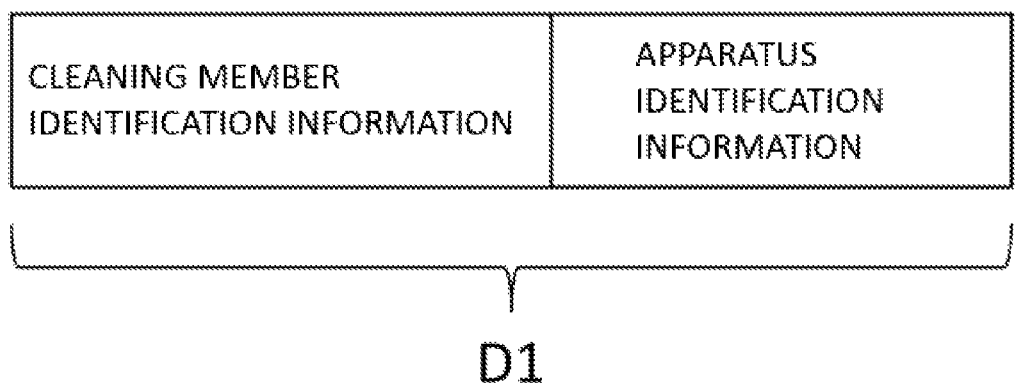
FIG. 10 is a diagram illustrating exemplary contents of data extracted/generated at the start of the break-in processing according to the third embodiment of the present invention.

Information for uniquely identifying a record is stored in the "ID" field in the database in Table 1. Further, information for uniquely identifying each cleaning apparatus of interest is stored in the "apparatus identification information" field. Information for identifying the type of a cleaning member is stored in "cleaning member identification information." The information is previously assigned with a discrimination as to whether the cleaning member is a roll cleaning member (indicated as "Roll" in "Table 1") or a pencil cleaning member (indicated as "Pen" in "Table 1") or a type uniquely defined depending on a form such as shape of a cleaning member. A predetermined time for starting the break-in processing on a part to be next exchanged (new cleaning member) is stored in the "predetermined time" field depending on each cleaning member. Each value of the accumulated use time after a cleaning member is first placed in the substrate cleaning apparatus is stored in the "accumulated use time" field while being sequentially updated. When each cleaning member exceeds the preset predetermined time in the database, the overall control unit 150 controls starting the break-in processing on a cleaning member corresponding to an extracted record. The data extracted and generated for starting the break-in processing may be a collection of data D1 as shown in FIG. 10.

Figure 9:
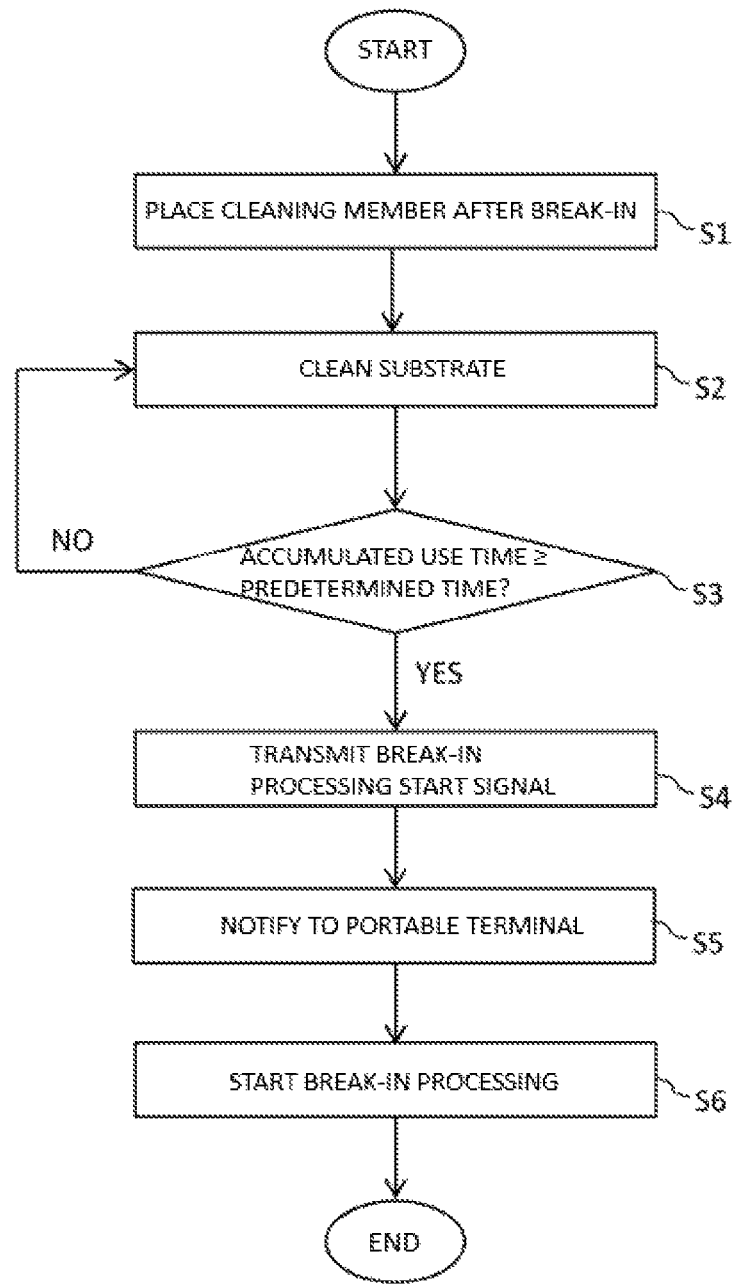
FIG. 9 is a flow showing an exemplary control method using the break-in system according to the third embodiment of the present invention.

The control method according to the present embodiment will be described with reference to FIG. 9 by way of example. The description will be made by use of an aspect in which information for exchanging cleaning members 200 by time (such as information that a timing to exchange is approaching or information that exchange is required), but is not limited to the aspect. There may be employed an aspect in which a cleaning detection unit 170 (see FIG. 8) connected to the overall control unit 150 is provided and the cleaning detection unit 170 measures a press force against a substrate W cleansed by the substrate cleaning apparatus and a distance between the substrate W and the cleaning members 200 thereby to measure information for exchanging cleaning members 200.

At first, the broken-in cleaning members 200 are placed in the substrate cleaning apparatus (S1). At this time, the use start times of the cleaning members 200 are stored in the overall storage unit 160.

When the cleaning members 200 are placed in the substrate cleaning apparatus in this way, a processing of cleaning a substrate W by the cleaning members 200 is started (S2). In the meanwhile, an actual operation time is added up as needed, and the accumulated use time as the total actual operation time is compared with the predetermined time as needed. The predetermined time may be set in consideration of a time required to attach a new cleaning member 200, such as exchange time, and if the break-in processing requires a certain time (one hour, for example), the predetermined time may be set slightly longer (several to 10 minutes longer) than the certain time (one hour, for example).

When the accumulated use time is the predetermined time or more, the information for exchanging cleaning members including the cleaning member identification information and the apparatus identification information, or a break-in processing start signal is generated and the signal is transmitted from the second communication unit 320 to the first communication unit 310 (S4). When receiving the information, the first communication unit 310 notifies a work start signal indicating that the break-in processing is to be started, or the like to the portable terminal 350 such as Smartphone or cell phone of the worker (S5). Alternatively, the break-in processing start signal received by the first communication unit 310 is sent to the break-in control unit 50, and the signal is converted into a signal capable of being received by the portable terminal 350 such as Smartphone or cell phone of the worker in the break-in control unit 50 and then may be transmitted from the first communication unit 310 to the portable terminal 350 (S5).

The worker who receives the notification places a new cleaning member 200 in the break-in apparatus 100 so that the break-in processing is started on the cleaning member 200 (S6).

When the break-in control unit 50 has a program (not shown) that the apparatus automatically sets which cleaning member in which type and shape is to be broken in based on the break-in processing start signal, each device in the break-in apparatus may be controlled based on the break-in processing start signal. Alternatively, the operator individually confirms and determines which cleaning member in which type and surface property is to be broken in, and the operator may manually input the setting items of the recipe and conditions of the break-in processing into the break-in control unit 50 via an input device (not shown) (also in this case, however, the end time of the break-in processing or the recipe itself of the break-in processing may be automatically updated or set by the program provided in the break-in control unit 50 based on the break-in processing start signal).

Fourth Embodiment

A fourth embodiment of the present invention will be described below.

Figure 11:
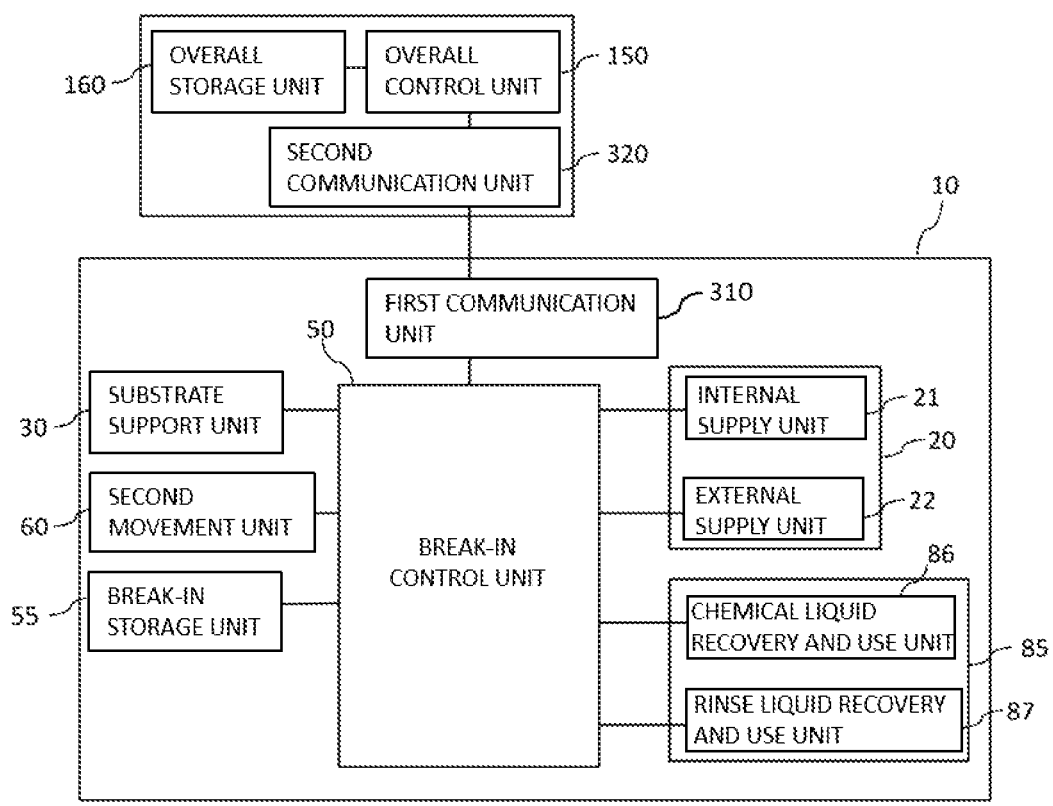
FIG. 11 is a block diagram showing the configurations of the substrate cleaning apparatus and the break-in module according to a fourth embodiment of the present invention.

Each of the above embodiments assumes that the supply units 20 are coupled to the chemical liquid reservoir 81 and/or the rinse liquid reservoir 82 and the supply units 20 supply a chemical liquid and/or a rinse liquid supplied from the chemical liquid reservoir 81 and/or the rinse liquid reservoir 82. The break-in apparatus 100 according to the present embodiment has a recovery and use unit 85 for recovering and using the cleaning liquid supplied to the dummy substrate W1 as shown in FIG. 11. The supply units 20 are configured to supply the dummy substrate W1 with the cleaning liquid recovered by the recovery and use unit 85 (to circulate the cleaning liquid). A filter for filtering the cleaning liquid before or after being recovered by the recovery and use unit 85 may be provided. The present embodiment can employ all the aspect described in each of the above embodiments. The same members as those described in each of the above embodiments are denoted with the same reference numerals, and will be described.

The recovery and use unit 85 according to the present embodiment may have a chemical liquid recovery and use unit 86 for recovering and using a chemical liquid and a rinse liquid recovery and use unit 87 for recovering and using a rinse liquid. The aspect shown in FIG. 11 shows that the recovery and use unit 85 is connected to the break-in control unit 50 or is electrically connected thereto. There may be physically configured such that the chemical liquid recovery and use unit 86 is connected to each of the internal supply units 21 and the external supply units 22 and supplies each of the internal supply units 21 and the external supply units 22 with the chemical liquid. Similarly, there may be configured such that the rinse liquid recovery and use unit 87 is coupled to each of the internal supply units 21 and the external supply units 22 and supplies each of the internal supply units 21 and the external supply units 22 with the rinse liquid.

According to the aspect of the present embodiment, it is beneficial that the supply units 20 do not need to be coupled to the cleaning liquid reservoir 80 and the break-in processing can be performed by the break-in apparatus 100 even if the supply units 20 are placed not to be able to be coupled with the cleaning liquid reservoir 80.

As described above, if the kind of a substrate to be cleaned changes or the number of substrates to be cleaned increases, the layout of the substrate cleaning apparatus in the housing may be changed. Thus, it is very beneficial to be able to freely select where the break-in apparatus 100 is placed.

There may be configured such that the break-in apparatus 100 according to the present embodiment can be coupled with the cleaning liquid reservoir 80 thereby to perform the break-in processing by use of a cleaning liquid supplied from the cleaning liquid reservoir 80.

Fifth Embodiment

A fifth embodiment of the present invention will be described below.

Figure 12:
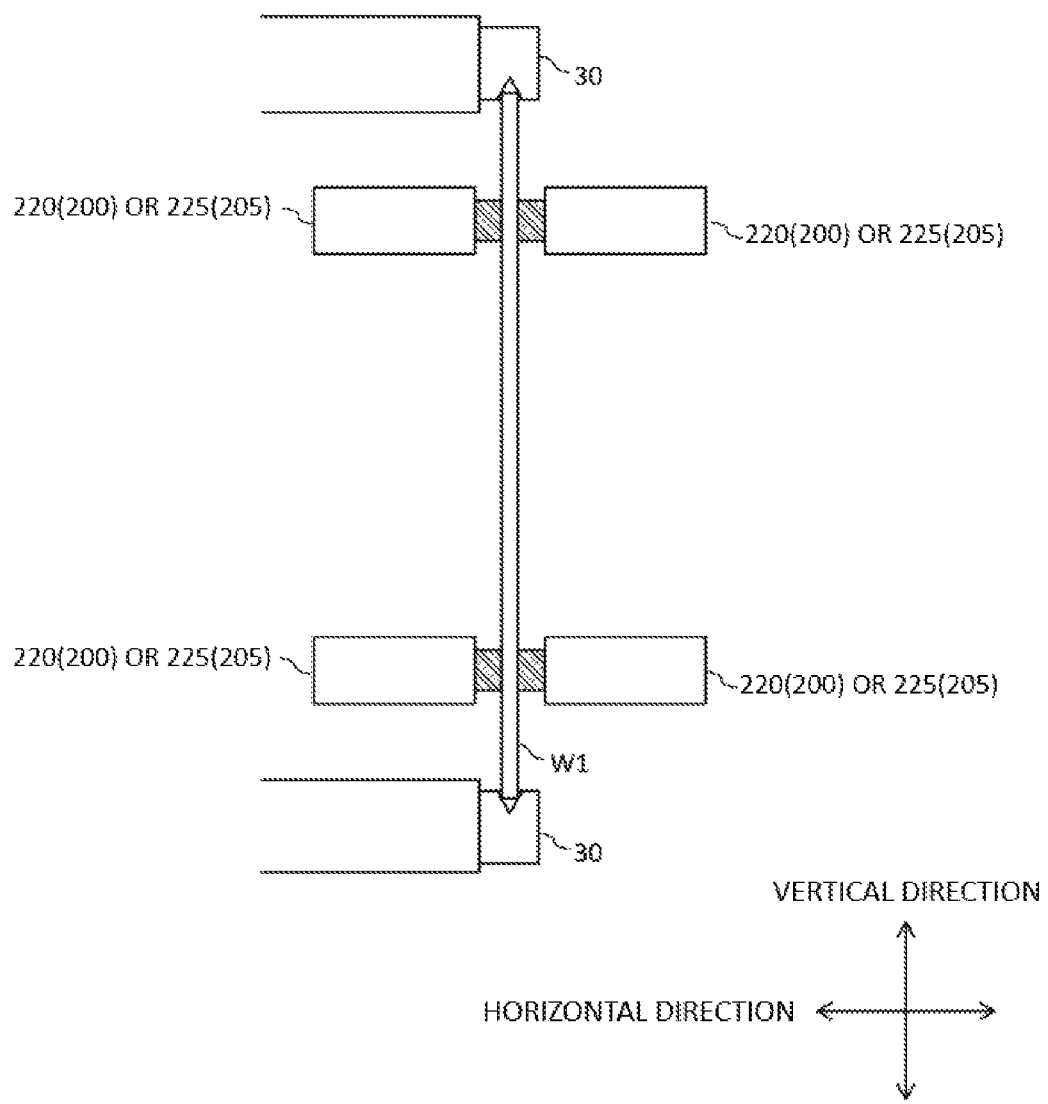
FIG. 12 is a side view showing an aspect in which pencil cleaning members or dummy pencil cleaning members are attached to the break-in module according to a fifth embodiment of the present invention.

Each of the above embodiments has been described by use of the aspect in which the roll cleaning members 210 are used for the cleaning members 200 to break in the roll cleaning members 210, but the present embodiment will be described by use of an aspect in which the pencil cleaning members 220 are used for the cleaning members 200 to break in the pencil cleaning members 220 as shown in FIG. 12. The present embodiment can employ all the aspects described in each of the above embodiments. The same members as those described in each of the above embodiments are denoted with the same reference numerals, and will be described. The break-in apparatus 100 according to the present embodiment may be configured to be able to break in both the roll cleaning members 210 and the pencil cleaning members 220 or may be configured to be able to break in only the pencil cleaning members 220.

Both the pencil cleaning members 220 and the roll cleaning members 210 conventionally have a similar problem, and the break-in processing on the pencil cleaning members 220 is performed by the substrate cleaning apparatus itself, and thus there is a problem that the substrate cleaning apparatus cannot clean a substrate during the break-in processing and the substrate cleaning apparatus can be used to clean a substrate W for a short time in a certain period. All the aspects described above are applied to the pencil cleaning members 220, and the above problem of the pencil cleaning members 220 can be solved and beneficial effects can be realized.

Figure 13:
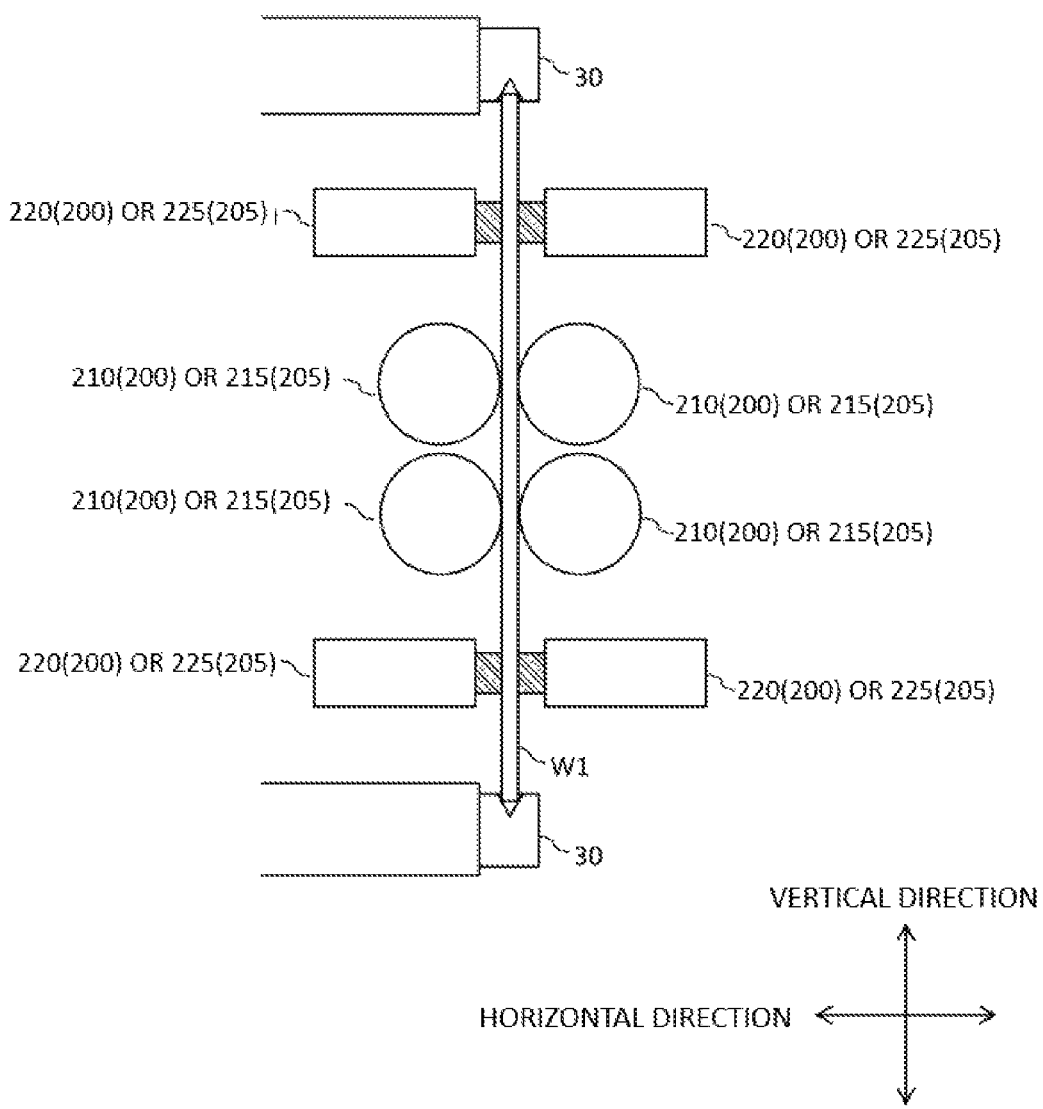
FIG. 13 is a side view showing an aspect in which pencil cleaning members or dummy pencil cleaning members and roll cleaning members or dummy roll cleaning members are attached to the break-in module according to the fifth embodiment of the present invention.

As shown in FIG. 13, there may be configured such that the roll cleaning members 210 contact around the center (large-diameter part) of the dummy substrate W1 and the pencil cleaning members 220 contact with the periphery of the dummy substrate unlike the roll cleaning members 210. In the configuration, it is beneficial that the roll cleaning members 210 and the pencil cleaning members 220 can be broken in by the same apparatus at the same time.

As described above, the present embodiment can employ all the aspects described in each of the above embodiments, and the cleaning member holding units 40 can hold the dummy cleaning members 205 such as dummy pencil cleaning members 225.

The description of each embodiments and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SIGNS LIST

20: Supply unit
30: Substrate support unit
40: Cleaning member holding unit
60: Second movement unit
85: Recovery and use unit
90: First movement unit
100: Break-in apparatus
200: Cleaning member
205: Dummy cleaning member
210: Roll cleaning member
215: Dummy roll cleaning member
220: Pencil cleaning member
225: Dummy pencil cleaning member 310: First communication unit
320: Second communication unit
W1: Dummy substrate

The invention claimed is:

1. A break-in apparatus for performing a break-in processing on a cleaning member comprising:
   a supply unit for supplying a cleaning liquid;
   a substrate support unit for holding a dummy substrate; and
   a cleaning member holding unit for performing the break-in processing on the cleaning member by rotating the cleaning member and bringing the cleaning member into contact with the dummy substrate; and
   a recovery and use unit for recovering and using the cleaning liquid supplied to the dummy substrate, wherein
   the supply unit supplies the dummy substrate with the cleaning liquid recovered by the recovery and use unit.

2. The break-in apparatus according to claim 1, wherein the cleaning member holding unit is configured to be able to hold three or more cleaning members.

3. The break-in apparatus according to claim 1, wherein the cleaning member is a roll cleaning member or a pencil cleaning member.

4. The break-in apparatus according to claim 1, wherein the cleaning member holding unit is configured to be able to hold two or more cleaning members and to contract the cleaning members with each of a front side and a backside of the dummy substrate, and
   the substrate support unit holds the dummy substrate to vertically extend.

5. The break-in apparatus, according to claim 1, further comprising
   a first movement unit for enabling the break-in apparatus to move.

6. The break-in apparatus according to claim 1, wherein the supply unit starts to supply the cleaning liquid from inside the cleaning member, and then the supply unit starts to supply the cleaning liquid from outside the cleaning member.

7. The break-in apparatus, according to claim 1, further comprising
   a detection unit for detecting a force applied to the cleaning member.

8. The break-in apparatus according to claim 1, further comprising
   a first communication unit for making communication with a substrate cleaning apparatus, wherein the break-in apparatus starts the break-in processing for the cleaning member when receiving information from the first communication unit.

9. The break-in apparatus according to claim 1, wherein the cleaning member holding unit is able to hold a dummy cleaning member.

10. A break-in system comprising:
    a break-in apparatus having a supply unit for supplying a cleaning liquid, a substrate support unit for holding a dummy substrate, and a cleaning member holding unit for holding a cleaning member removably and performing a break-in processing on the cleaning member by rotating the cleaning member and bringing the cleaning member into contact with the dummy substrate;
    a substrate cleaning apparatus for cleaning a substrate by a cleaning member; and
    a recovery and use unit for recovering and using the cleaning liquid supplied to the dummy substrate.

11. A break-in system comprising:
    a break-in apparatus having a supply unit for supplying a cleaning liquid, a substrate support unit for holding a dummy substrate, a cleaning member holding unit for holding a cleaning member removably and performing a break-in processing on the cleaning member by rotating the cleaning member and bringing the cleaning member into contact with the dummy substrate, and a first communication unit for receiving information about exchanging the cleaning member from outside;
    a substrate cleaning apparatus for cleaning a substrate by a cleaning member, the substrate cleaning apparatus having a second communication unit for transmitting the information about exchanging the cleaning member to the break-in apparatus; and
    a break-in control unit having a program for controlling the break-in apparatus based on the information about exchanging the cleaning member, wherein
    the information about exchanging the cleaning member includes cleaning member identification information and apparatus identification information.

12. A readable storage media storing a program, which works in a computer, for controlling the break-in system according to claim 11, wherein
    the program, in operation, makes the computer control the break-in system so that the break-in system according to claim 11 performs the break-in processing on the cleaning member.

* * * * *